United States Patent
Fransis

(10) Patent No.: US 6,564,045 B1
(45) Date of Patent: May 13, 2003

(54) BROADBAND FREQUENCY MULTIPLIER

(75) Inventor: Bert Fransis, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/461,647

(22) Filed: Dec. 14, 1999

(51) Int. Cl.[7] .............. H04B 1/26; H04B 1/18; H04B 1/16; H04B 7/00
(52) U.S. Cl. ........... 455/318; 455/189.1; 455/190.1; 455/207; 455/209; 455/216; 455/259; 455/314; 455/323
(58) Field of Search ............ 455/188.1, 189.1, 455/190.1, 205, 207, 208, 209, 216, 255, 257, 256, 258, 259, 266, 313, 314, 318, 319, 323; 375/316, 324, 328, 329, 344; 329/304, 306, 307, 323, 325

(56) References Cited

U.S. PATENT DOCUMENTS 6,072,997 A * 6/2000 Kawai .................. 455/324
6,233,444 B1 * 5/2001 Nakanishi ............. 455/314

* cited by examiner

*Primary Examiner*—Rafael Perez-Gutierrez
(74) *Attorney, Agent, or Firm*—Procopio, Cory, Hargreaves & Savitch, LLP

(57) ABSTRACT

An LO generation circuit generates an LO signal by doubling and quadrupling the frequency of a VCO signal. The frequency doubling and quadrupling provides high VCO-RF isolation as well as suppression of spurious noise signals in the LO output. The frequency doubler takes a quadrature signal input and utilizes mixer cores having double balanced transistor pairs to provide an output signal having doubled frequency but maintaining the phase balance of the input signal.

20 Claims, 6 Drawing Sheets

BROADBAND FREQUENCY MULTIPLIER

FIELD OF THE INVENTION

The present invention relates generally to generation of an LO signal for down conversion of a received RF signal and, more particularly, relates to a method and apparatus for doubling and quadrupling the frequency of an LO signal with superior spur suppression.

BACKGROUND OF THE INVENTION

In many applications, generation of a local oscillator ("LO") signal for down conversion of a received RF signal is required. Examples include digital broadcast system (DBS) tuners or receivers, cable modem tuners, and a variety of devices operating within wireless communication systems such as a cellular telephones, cordless telephones, wireless handsets, mobile stations and pagers. In these and other applications, the received RF signal usually takes the form of a carrier signal at a carrier frequency that is modulated by an information signal at a baseband frequency. As the baseband frequency is typically much lower than the carrier frequency, the receiver must translate or down convert the carrier frequency of the RF signal down to the baseband frequency in order to extract the baseband information from the signal.

In some systems, the frequency of the RF signal is first converted to an intermediate frequency (IF) and the IF is then converted to the baseband frequency. In other systems, which are referred to as direct translation or direct conversion systems, the RF frequency is converted directly to the baseband frequency. Direct conversion systems are advantageous in that the IF stage is eliminated, thereby reducing the cost and size of communication devices incorporating the systems.

A mixer usually carries out frequency translation or down conversion of RF signals. The mixer combines the RF signal with an LO signal to produce an output signal at the IF or baseband frequency. Often, the local oscillator takes the form of a voltage-controlled oscillator (VCO). In order to convert a receive signal frequency ($\omega_{RF}$) to a desired intermediate frequency ($\omega_{IF}$), for instance, the receive signal is mixed with a sinusoidal LO signal of the form $A_0 \cos\omega_0 t$, where $\omega_0=\omega_{RF}-\omega_{IF}$. In a direct translation system the intermediate frequency is equal to zero ($\omega_{IF}=0$), so $\omega_0=\omega_{RF}$.

Direct translation receiver architectures are problematic in that there are likely to be interactions and interference between the RF signal and the VCO signal. Since, for direct conversion, the LO frequency must be equal to the RF signal frequency (i.e., $\omega_0=\omega_{LO}=\omega_{RF}$), the receiver may receive its own LO signal (self-interference). Leakage of the VCO signal into the RF signal, or vice-versa, can create spurious signal information and can cause DC offsets in the down-converted signal large enough to saturate subsequent components and prevent amplification of the baseband signal. Conversely, leakage of the RF signal into the VCO can cause frequency pulling and lead to an increase in phase noise, resulting in overall system desensitization.

For these reasons, direct conversion receivers require a significant amount of isolation or shielding between the RF signal and VCO. Alternatively, the VCO output frequency can be kept outside the RF signal bandwidth and passed through a frequency multiplier to generate an LO signal at the RF frequency. In one conventional architecture, for example, the VCO outputs a signal at half of the receive frequency and is then passed through a frequency doubler to generate an LO signal at the RF frequency.

This approach can still be problematic. In some systems such as wideband RF systems, a VCO signal at half the RF frequency may still be within the RF frequency range. The RF frequency band in a digital broadcast system (DBS), for example, extends from 950 MHz to 2150 MHz. Halving the corresponding VCO frequency yields a VCO frequency band extending from 475 MHz to 1075 MHz, resulting in an overlap in the frequency band extending from 950 MHz to 1075 MHz. To down convert a receive signal at 2150 MHz, for example, the VCO frequency would be tuned to 1075 MHz and then doubled to 2150 MHz by a frequency multiplier. Prior to doubling, however, the VCO frequency at 1075 MHz may leak into the down conversion mixer and cause down conversion of signals at 1075 MHz, thereby creating a false baseband signal on top of the properly down converted 2150 MHz RF signal. Moreover, VCO spurs (i.e., harmonics) created by the frequency multiplication may fall within the receive band and may be down converted to create spurious baseband signals.

SUMMARY OF THE INVENTION

The subject invention is directed toward an apparatus and method for generating an LO signal that isolates the VCO and RF signals and generates low spurious output. An LO generation circuit is provided that includes a broadband frequency doubler that receives a pair of differential input signals with a given frequency and phase relationship and creates a pair of differential output signals. The frequency of the output signals is twice the frequency of the input signals, but the phase relationship of the input signals is maintained. In addition to doubling the frequency and maintaining the phase relationship of the input signals, spurious noise signals and RF-VCO leakage are suppressed. In some applications, the input signal frequency may need to be quadrupled while still maintaining the same phase relationship of the signals. In this case, a second doubler is used in series with the first doubler. This configuration quadruples the frequency of the original signal and, since the doublers do not alter the phase relationship of the signals, the phase relationship of the original signals is maintained at the output of the second doubler.

In one embodiment of the invention, an LO signal generation circuit for generating an LO signal to down convert an RF signal within an RF bandwidth is provided. The circuit includes a VCO that generates a signal having a frequency within a bandwidth that is a subset of the RF bandwidth. A first phase shifter is coupled to the VCO and converts the VCO signal into a quadrature VCO signal having an in-phase component I and a phase-shifted component Q. A first frequency doubler is coupled to the first phase shifter and doubles the frequency of the quadrature VCO signal while maintaining the phase relationship between the quadrature components. A second frequency doubler is coupled to the first frequency doubler and redoubles the frequency of the signal output by the first frequency doubler to output a signal having a quadrupled VCO frequency. A switch selects one of the outputs from the first frequency doubler or second frequency doubler to serve as the LO signal.

In another embodiment of the invention, an inventive frequency doubler is provided. The frequency doubler receives a differential signal having an in-phase component I and a quadrature component Q and outputs a signal having a frequency that is double the frequency of the input signal and a phase balance that is the same as the phase balance of the input signal.

The frequency doubler comprises four mixer cores. A first mixer core receives the I component of the input signal on two input ports and mixes the I components to generate an I product, and a second mixer core receives the Q component of the input signal on two input ports and mixes the Q components to generate a Q product. Means are provided for subtracting the Q product from the I product to generate the in-phase component of the output signal. A third mixer core receives the I component of the input signal on one input port and the Q component on another input port and mixes the I and Q components to generate an IQ product, and a fourth mixer core receives the I component of the input signal on one input port and the Q component on another input port and mixes the I and Q components to generate another IQ product. Means are provided for adding the two IQ products to generate the quadrature component of the output signal.

The present invention also provides a method for down converting an RF signal. The method comprises the following steps:

dividing the potential RF bandwidth into upper and lower portions;

receiving an RF signal;

if the RF signal is in the lower portion of the bandwidth, generating a VCO signal having a frequency that is one-half the frequency of the RF signal, passing the VCO signal through a phase shifter to yield an in-phase and a quadrature signal, and generating an LO signal by doubling the frequency of the VCO signal while maintaining the phase relationship between the in-phase and quadrature input signals;

if the RF signal is in the upper portion of the bandwidth, generating a VCO signal having a frequency that is one-fourth the frequency of the RF signal, passing the VCO signal through a phase shifter to yield an in-phase and a quadrature signal, doubling the frequency of the VCO signal while maintaining the phase relationship between the in-phase and quadrature input signals, and redoubling the frequency of the VCO signal to generate the LO signal; and down converting the RF signal by mixing the RF and LO signals.

A method for combining the frequencies of an in-phase signal I and a quadrature signal Q while maintaining the phase balance between the signals is also provided. The method comprises the following steps:

providing an in-phase signal I having a first frequency;

providing a phase-shifted signal Q having a second frequency;

squaring the I signal and the Q signal to generate an I product and a Q product;

multiplying the I and Q signals to generate first and second IQ products;

subtracting the Q product from the I product to generate an in-phase signal I' having a frequency equal to the sum of the first and second frequencies; and adding the first and second IQ products to generate a quadrature signal Q' having a frequency equal to the sum of the first and second frequencies, wherein the phase relationship between the in-phase output signal I' and the quadrature output signal Q' is the same as the phase relationship between the in-phase input signal I and the quadrature input signal Q.

These and other aspects of the present invention will become apparent in the following description, drawings and claims.

BRIEF DESCRIPTION OF THE DRAWINGS

The present invention is described with reference to the accompanying drawings. In the drawings, like reference numbers indicate identical or functionally similar elements.

DETAILED DESCRIPTION OF PREFERRED EMBODIMENTS

Figure 1:
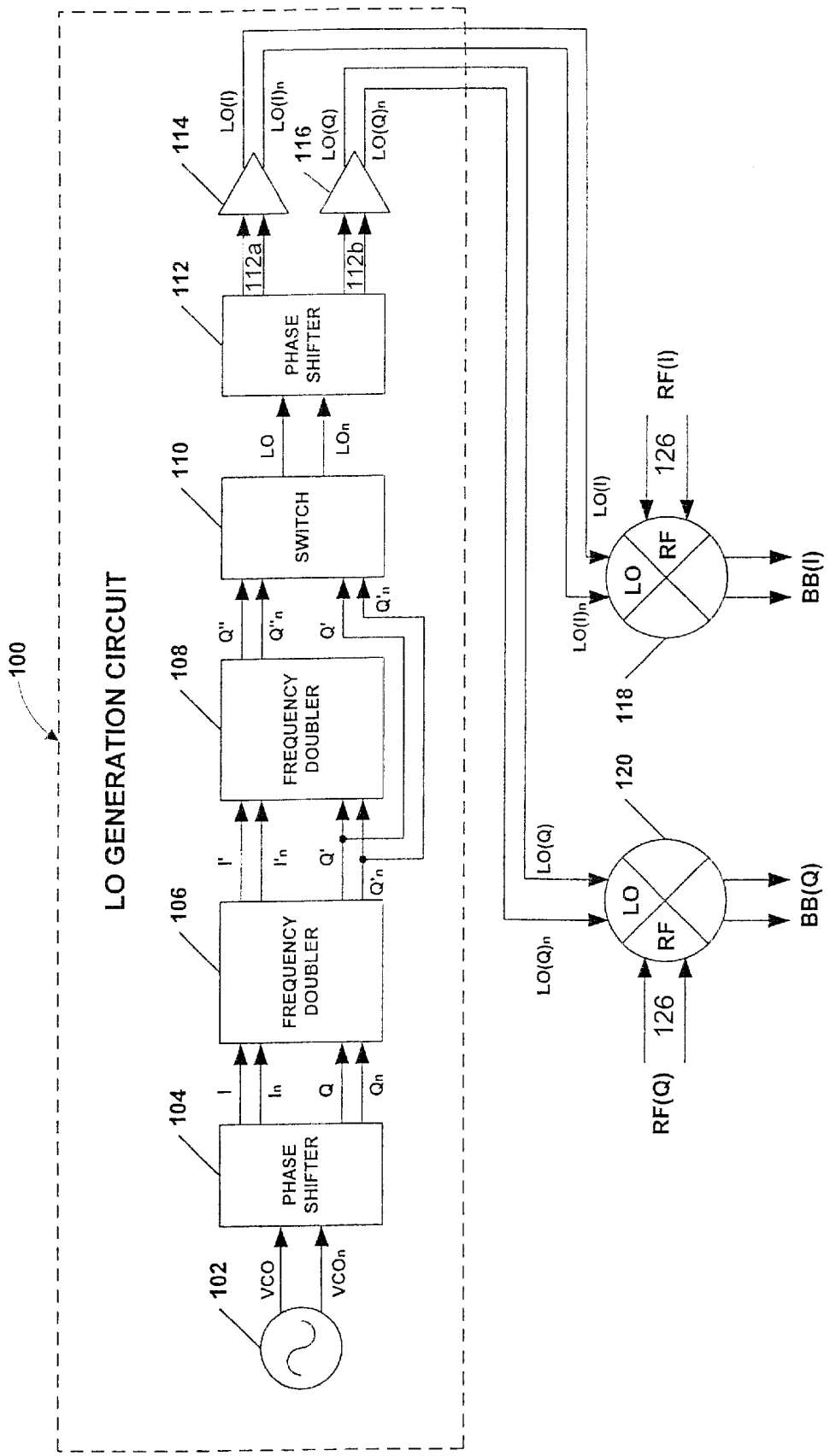
FIG. 1 is a block diagram of an LO generation circuit according to the present invention.

An LO signal generation circuit 100 according to the present invention is depicted in block form in FIG. 1. Circuit 100 may be implemented in any device where generation of an LO signal for down conversion of a received RF (referred to as an "RF" signal herein) is required. It is particularly well suited for use in wide band systems that require frequency doubling and/or quadrupling in order to avoid RF-VCO interaction. In one embodiment, circuit 100 is implemented in a digital broadcast system (DBS) tuner or receiver for down conversion of RF signals. In another embodiment, circuit 100 is implemented in a cable modem tuner. In a still further embodiment, circuit 100 resides in the receiver of a device operating within a wireless communication system, such as a cellular telephone, cordless telephone, wireless handset, mobile station or pager. There are many broadband wireless communications systems, such as systems using spread spectrum technologies, to which circuit 100 is well suited. Alternatively, circuit 100 could be employed to generate an LO signal within the transmitter of a wireless communication device.

Circuit 100 comprises voltage-controlled oscillator (VCO) 102, first phase shifter 104, first frequency doubler 106, second frequency doubler 108, switch 110, and second phase shifter 112. Differential signals 112a and 112b output by second phase shifter 112 are amplified by amplifiers 114 and 116, and are then supplied to mixers 118 and 120 for down conversion of receive signals 126.

In one implementation, VCO 102 is a tunable oscillator with a resonator comprising an inductor-capacitor (LC) circuit. VCO 102 is tuned to a desired frequency by manipulating a control voltage; raising and lowering the control voltage acts to raise and lower the output frequency of VCO 102. A typical VCO can tune from ±5% to ±30% of a given center frequency. VCO 102 outputs a differential signal of the form $A\cos(\omega t)$ that has a positive component VCO and a negative component $VCO_n$.

The differential signal output by VCO 102 is supplied to phase shifter 104. Phase shifter 104 receives the differential VCO signal and generates two differential, quadrature output signals. By quadrature, it is meant that the signals are identical but ninety degrees out-of-phase. The in-phase or "I" component has the form $A\cos(\omega t)$, and the phase-shifted or quadrature ("Q") component has the form $A\cos(\omega t \pm \pi/2)$. Hence, the positive and negative components of the in-phase differential output of phase shifter 104 are designated I and $I_n$, and the positive and negative components of the quadrature differential output are designated Q and $Q_n$.

The differential I and Q signals output by phase shifter 104, which are at the VCO operating frequency, are supplied to frequency doubler 106. As will be explained in more detail below, improved spur suppression is achieved when the inputs to the frequency doubler are in quadrature. Frequency doubler 106 constructively combines the I and Q signals to generate differential output signals I' and Q' having twice the frequency of the input signals. Of critical importance, and as will be explained in more detail below, doubler 106 maintains the quadrature balance of the doubled signals. That is, output signals I' and Q' have the same phase relationship as input signals I and Q. I' is the differential in-phase signal (positive and negative components designated by, respectively, I' and I'$_n$), and Q' is the quadrature signal (Q' and Q'$_n$).

In some situations, a signal of doubled frequency may be sufficient. Where a signal of quadrupled frequency is required, however, the frequency of signals I' and Q' must again be doubled. Second frequency doubler 108 is provided for this purpose. Since doubler 106 maintains the quadrature balance on its output signals, spur suppression by doubler 108 is again enhanced. Hence, doubler 108 produces a pair of differential signals 1" and Q" that are in quadrature and have a frequency that is four times the VCO operating frequency. Only the quadrature portion (positive and negative components designated Q" and Q$_n$") of the output is passed on to switch 110.

As noted above, since doubler 106 maintains the quadrature balance of input signals I and Q in output signals I' and Q', spur suppression by the doubler 108 is enhanced. There is no requirement of an extra phase shifter interposed between the two doublers to achieve this quadrature balance. Elimination of an extra phase shift operation eliminates losses associated with that operation and permits a smaller and less expensive circuit design.

Switch 110 receives the quadrature output signal Q" from doubler 108 and the quadrature output signal Q' from doubler 106. If a doubled VCO frequency is required, switch 110 selects Q', and if a quadrupled VCO frequency is required, switch 110 selects Q". It should be noted that the in-phase signals I' and I" could be supplied to switch 110, rather than quadrature signals Q' and Q", with the same results achieved. Switch 110 may take the form of an actual switch or it may take the form of disabling or enabling circuitry in the path of signals Q' and Q". If, for example, level shifters are required in the paths of signals Q' and Q" to obtain a required signal level, switch 110 may operate by enabling or disabling the level shifter in the path of the appropriate signal. Hence, if signal Q' is required, the level shifter in the path of signal Q' is enabled, while the level shifter in the path of signal Q" is disabled to block signal Q".

The operation of circuit 100 is better understood with reference to the following example, which presumes that circuit 100 is implemented in a DBS receiver. The bandwidth of a typical DBS receiver extends from 950–2150 MHz. This bandwidth can be divided into two halves: a lower half extending from 950–1800 MHz and an upper half extending from 1800–2150 MHz. To receive RF signals in the lower bandwidth, VCO 102 is configured to operate within a range of 475–900 MHz. The frequency of the VCO output signal, after passing through phase shifter 104 to generate quadrature signals I and Q, is doubled by doubler 106 to generate differential signals I' and Q' having a frequency within the lower half of the RF signal bandwidth (950–1800 MHz). Switch 110 selects Q' and passes it on to phase shifter 112. Importantly, the VCO operating bandwidth of 475–900 MHz is completely outside of the RF signal bandwidth, which extends from 950–2150 MHz.

For the upper half of the RF signal range, 1800–2150 MHz, VCO 102 is configured to operate within a bandwidth of 450 . 537.5 MHz. The frequency of the VCO output signal is doubled by doubler 106 to generate differential quadrature signals I' and Q' having a frequency within a range of 900–1075 MHz. The frequency of these signals is doubled again by doubler 108 to generate differential quadrature signals I" and Q" having a frequency within the upper half of the receive signal bandwidth (1800–2150 MHz). Switch 110 selects Q" and passes it on to phase shifter 112. In this manner, isolation is accomplished by creating non-overlapping frequency bandwidths for VCO 102 and the entire bandwidth of the RF signal.

Switch 110 outputs a differential LO signal having a frequency that is double or quadruple the VCO frequency. The positive and negative components of the differential LO signal are designated as, respectively, LO and LO$_n$. The differential LO signal is supplied to second phase shifter 112, which generates a pair of differential outputs LO(I) and LO(Q) having a quadrature phase relationship. Phase shifter 112 operates in the same manner as does phase shifter 104. Differential outputs LO(I) and LO(Q) are amplified to an appropriate level by amplifiers 114 and 116 and represent the output of LO generation circuit 100.

Mixers 118 and 120 are provided to down convert a received RF signal to the baseband frequency. Each mixer has an LO port and an RF port. Mixer 118, which down converts the in-phase portion of the RF signal, receives the differential LO(I) signal on its LO port and a differential received RF(I) signal on its RF port. Mixer 118 combines the signals in a known manner and generates an in-phase output BB(I) at the baseband frequency. Mixer 120, which down converts the quadrature portion of the RF signal, receives the differential LO(Q) signal on its LO port and a differential received RF(Q) signal on its RF port. It combines the signals in a known manner and generates a quadrature output BB(Q) at the baseband frequency.

As noted above, frequency doubling and quadrupling may still create problematic spurs at multiples of the VCO operating frequency that overlap with the RF frequency range and create erroneous signal information in the translation to baseband. Spurs may be introduced at half, twice, triple and four times the VCO frequency. For example, if the VCO output frequency is 500 MHz, a spur at twice the frequency would be at 1000 MHz. For this reason, it is important to suppress these spurs below a certain level to avoid erroneous data from appearing in the translation to baseband. Better spur suppression is achieved if the signals supplied to the frequency doublers are in quadrature, and if the doublers maintain the phase balance between the input and output signals.

Figure 2:
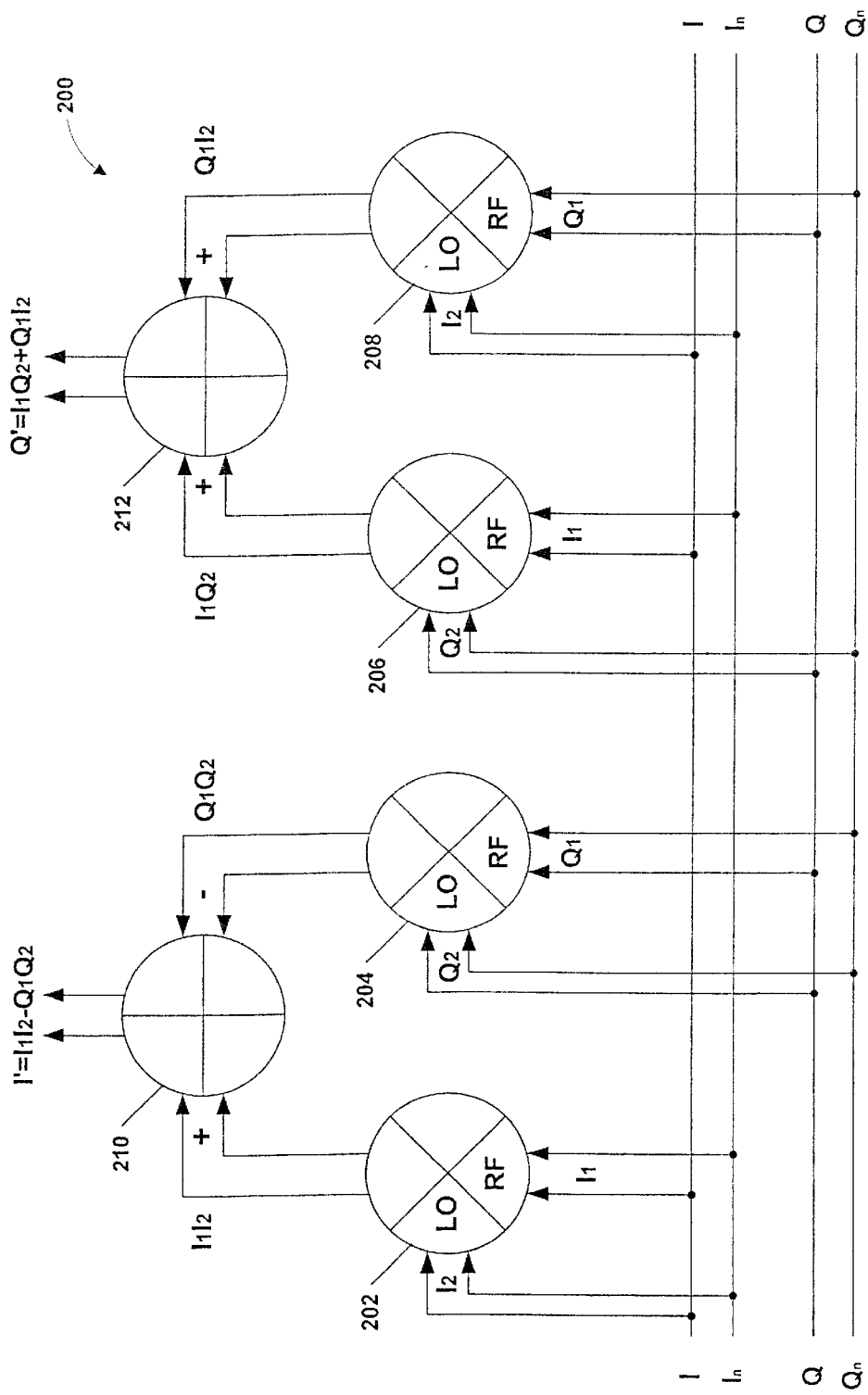
FIG. 2 is a block diagram of a frequency doubler according to the present invention.

FIG. 2 depicts in block form an inventive frequency doubler 200 that maintains in the output signals the phase relationship that is present between the input signals. Doublers 106 and 108 of FIG. 1, for example, may be implemented using the architecture of doubler 200. Doubler 200 comprises four mixer cores 202, 204, 206 and 208 and two summing elements 210 and 212. Each mixer core has an "RF" differential input port and an "LO" differential input port. The mixer cores combine the input quadrature signals and the summing elements, in turn, combine the outputs of the mixer cores in a manner to generate output quadrature signals having doubled frequency while maintaining the phase relationship of the input quadrature signals.

Differential quadrature signals I (having a positive component I and a negative component I$_n$) and Q (having a positive component Q and a negative component $Q_n$) are input to frequency doubler 200. The in-phase or "I" signal has the form $A\cos(\omega t)$, and the ninety degrees phase-shifted quadrature ("Q") component has the form $A\cos(\omega t \pm \pi/2)$. The I and Q signals may originate from a VCO and be put into quadrature form by a phase shifter (i.e., the outputs of phase shifter 104 in FIG. 1), or they may be received directly from a previous frequency doubler (i.e., the outputs of frequency doubler 106 in FIG. 1). In the description below, the differential input to the lower or 'RF' port of the mixers is denoted collectively and with a subscript of '1' (i.e., $I_1$ or $Q_1$), and the differential input to the upper or 'LO' port of the mixers is denoted collectively and with a subscript of '2' (i.e., $I_2$ or $Q_2$).

Mixer core 202 receives the differential I signal (I and $I_n$) at each of its differential input ports. Hence, the differential signal received at the RF port of mixer core 202 is designated $I_1$ and the differential signal received at the LO port of mixer core 202 is designated $I_2$. Mixer core 202 combines (multiplies) the input signals and supplies the output product $I_1I_2$ to summing element 210. Mixer core 204 receives the differential Q signal (Q and $Q_n$) at each of its differential input ports. Hence, the differential signal received at the RF port of mixer core 204 is designated $Q_1$ and the differential signal received at the LO port of mixer core 204 is designated $Q_2$. Mixer core 204 combines (multiplies) the signals and supplies the output product $Q_1Q_2$ to summing element 210.

Summing element 210 subtracts the output of mixer core 204 from the output of mixer core 202 to generate the in-phase output $I'=I_1I_2-Q_1Q_2$ that has twice the frequency of the input signal I. Though not readily apparent at the moment, this mathematical operation does indeed yield an in-phase I output at twice the input frequency. This will be described in full detail in connection with FIG. 3.

Mixer core 206 receives the differential Q signal at its LO port, which is accordingly designated $Q_2$, and receives the differential I signal at its RF port, which is accordingly designated $I_1$. The signals are multiplied and the output product $I_1Q_2$ is supplied to summing element 212. Mixer core 208 receives the differential I signal at its LO port, which is accordingly designated $I_2$, and receives the differential Q signal at its RF port, which is accordingly designated $Q_1$. The signals are multiplied and the product $Q_1I_2$ is supplied to summing element 212. Summing element 212 performs an add operation to generate the quadrature output $Q'=I_1Q_2+Q_1I_2$ that has twice the frequency of the input signal Q. Moreover, the phase relationship between the quadrature output signals I' and Q' is the same as that which is present between the quadrature input signals I and Q. Again, the reasons that this mathematical operation yields a quadrature Q output at twice the input frequency will be explored in connection with FIG. 3.

Figure 3:
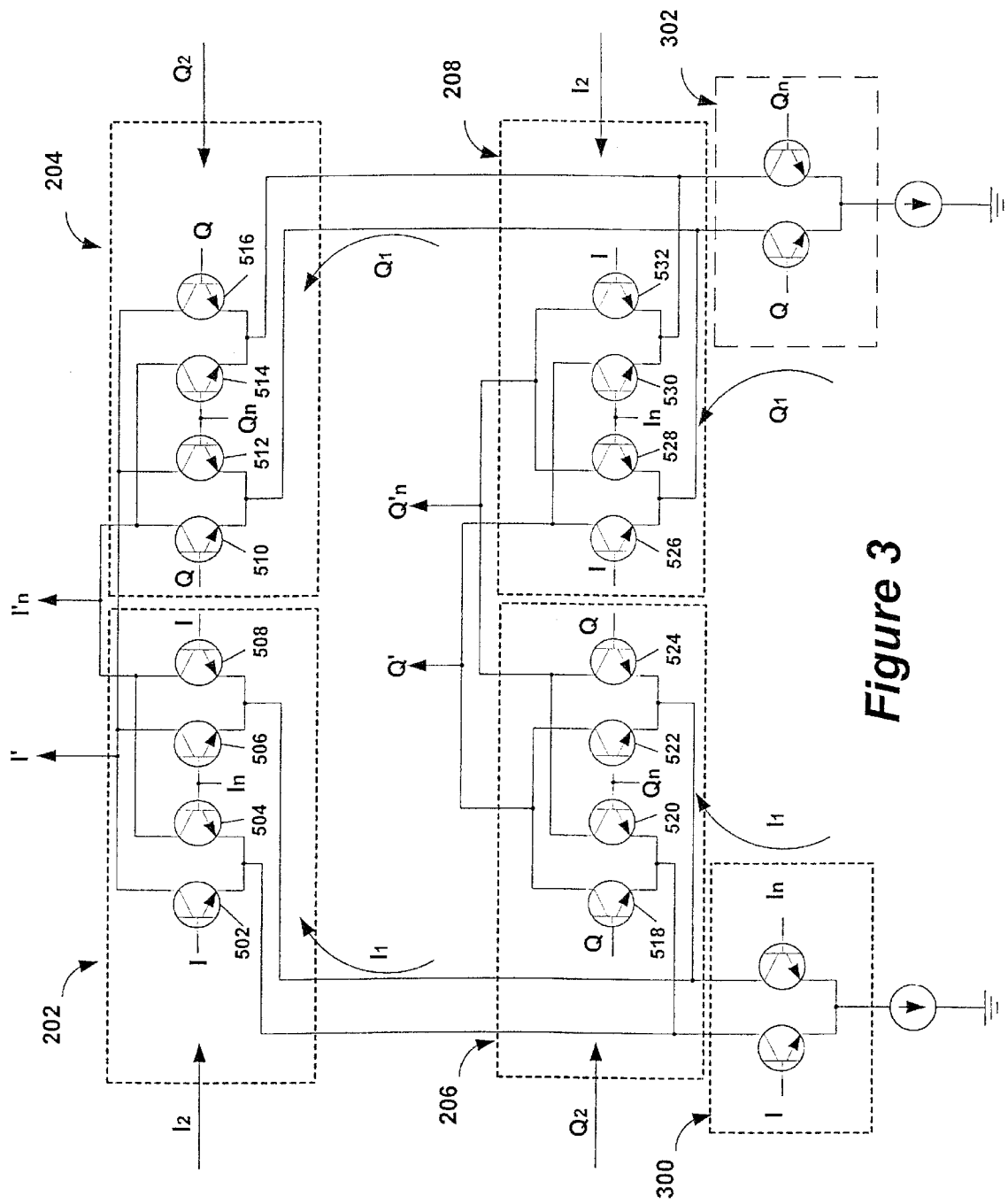
FIG. 3 is a schematic circuit diagram of the frequency doubler of FIG. 1.

A detailed circuit implementation of frequency doubler 200 is set forth in FIG. 3. Mixer cores 202, 204, 206 and 208 are implemented as blocks of differential transistor pairs. Each of the mixer cores works in conjunction with one or both of differential transistor pairs 300 and 302. The lower or 'RF' ports of the mixer cores comprise the differential inputs to the emitters of the transistor pairs. As in FIG. 2, the differential signals entering the mixer cores on these inputs are denoted collectively and with a subscript of '1' (i.e. $I_1$ or $Q_1$). The upper or "LO" ports of the mixer cores comprise the differential inputs to the bases of the transistor pairs. As in FIG. 2, the differential signals entering the mixer cores on these inputs are denoted collectively and with a subscript of '2' (i.e. $I_2$ or $Q_2$).

Referring to FIG. 3, it can be seen that mixer core 202 receives signal $I_1$ at its emitters or RF port, and signal $I_2$ at its bases or LO port. Mixer core 204 receives signal $Q_1$ at its emitters or RF port, and signal $Q_2$ at its bases or LO port. Mixer core 206 receives signal $I_1$ at its emitters or RF port, and signal $Q_2$ at its bases or LO port. Mixer core 208 receives signal $Q_1$ at its emitters or RF port, and signal $I_2$ at its bases or LO port.

Figure 4B:
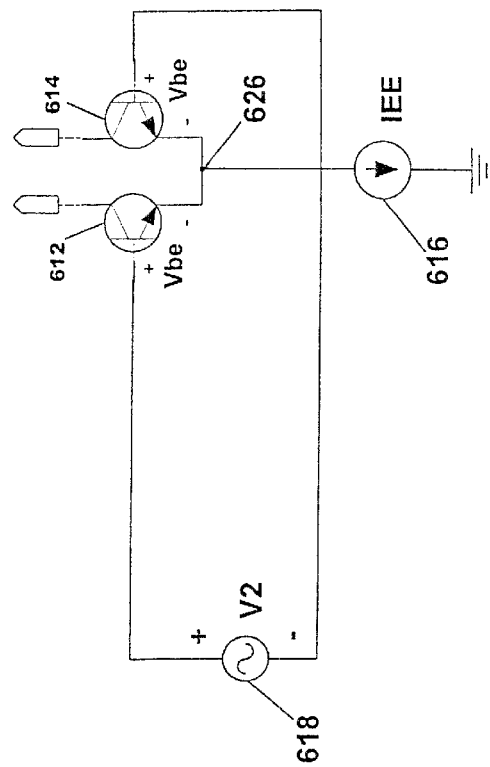
FIG. 4b is a schematic circuit diagram of a differential pair in a balanced multiplier circuit.
Figure 4A:
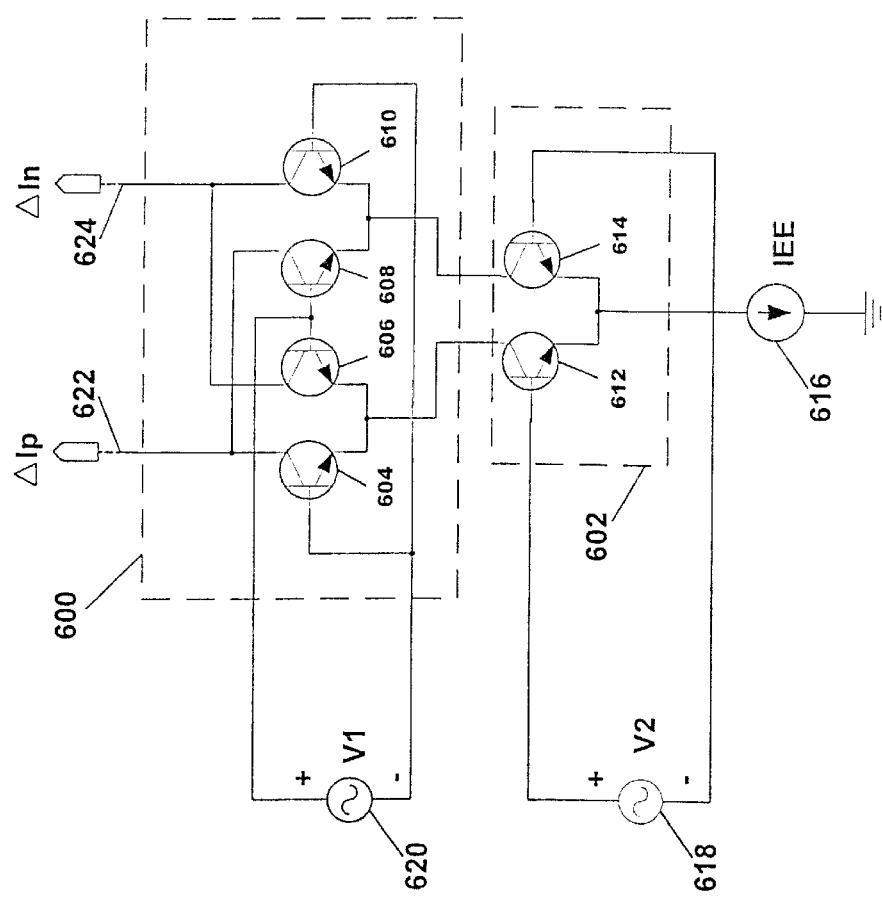
FIG. 4a is a schematic circuit diagram of a balanced multiplier circuit.

The behavior of the circuit of FIG. 3 is more easily understood by first considering the behavior of one block of balanced differential transistor pairs working in isolation with one pair of differential transistors. In this regard, FIG. 4a depicts in isolation one block 600 of balanced differential transistor pairs working in conjunction with a pair 602 of differential transistors. The combination of blocks 600 and 602 forms two differential amplifier cells. Transistors 604, 606, and 612 form the first cell and transistors 608, 610, and 614 form the second cell. FIG. 4b depicts in isolation the pair 602 of differential transistors. Mathematical analysis begins with reference to FIG. 4b.

Voltage source 618 supplies a voltage $V_2$ that is equal to the base-emitter voltage of transistor 612 minus the base-emitter voltage of transistor 614. This relationship can be expressed as:

$$V_2 = V_{be}(612) - V_{be}(614). \qquad (1)$$

The base-emitter voltages for transistors 612 and 614 can be expressed as:

$$V_{be}(612) = V_t \cdot ln[I_C(612)/I_{sat}]; \text{ and } V_{be}(614) = V_t \cdot ln[I_C(614)/I_{sat}]; \qquad (2)$$

where $V_t$ is the threshold voltage of the given transistor, $I_C$ is the collector current of the given transistor and $I_{sat}$ is the transistor saturation currents, which are assumed to be equal for the transistors. Equations (1) and (2) can be combined so that:

$$[I_C(612)/I_C(614)] = \exp(V_2/V_t). \qquad (3)$$

Looking at emitter node 626, in FIG. 4b, and assuming that $\alpha=1$ for transistors 612 and 614, the current IEE of current source 616 can be expressed as:

$$IEE \sim I_C(612) + I_C(614). \qquad (4)$$

Combining equation (3) and (4) results in:

$$I_C(612) = IEE/[1+\exp(-V_2/V_t)]; \text{ and } I_C(614) = IEE/[1+\exp(V_2/V_t)]. (5)$$

Referring back to FIG. 4a, similar expressions can be obtained for transistors 604, 606, 608, and 610. For example:

$$I_C(604) = I_C(612)/[1+\exp(-V_1/V_t)]; \text{ and } I_C(606) = I_C(612)/[1+\exp(V_1/V_t)]; \qquad (6)$$

where $V_1$ is the voltage supplied by source 620.

Next, in looking at the differential signal $\Delta I$ formed at output nodes 622 and 624 it can be seen that:

$$\Delta I = I_C(604) + I_C(608) - I_C(606) - I_C(610). \qquad (7)$$

Substituting equation (5) and (6) for collector currents in (7) yields the relation:

$$\Delta I = IEE[\tanh(V_1/2V_t)][\tanh(V_2/2V_t)]. \qquad (8)$$

If $V_1$ and $V_2$ are assumed to be small relative to $V_t$, then $\tanh(x) \approx x$ and, therefore, $\Delta I$ is proportional to the product of $V_1$ and $V_2$. If voltages $V_1$ and $V_2$ supplied by sources 618 and 620 are sinusoidal, then the differential output can be expressed as:

$$\Delta I = V_1 V_2 = A\cos(\omega_1 t) * B\cos(\omega_2 t). \quad (9)$$

Additionally, the differential output $\Delta I$ possesses a positive component $\Delta I_p$ and a negative component $\Delta I_n$ that, from equation (7), can be expressed as:

$$\Delta I_p = I_C(604) + I_C(608); \text{ and } \Delta I_n = I_C(606) - I_C(610). \quad (10)$$

Referring back to FIG. 3, the combination of mixer core 202 and transistor pair 300 can be seen to multiply differential signals $I_1$ and $I_2$ in the same manner that $V_1$ and $V_2$ are multiplied in FIG. 4a. Similarly, the combination of mixer core 204 and transistor pair 302 multiplies differential signals $Q_1$ and $Q_2$, mixer core 206 multiplies differential signals $I_1$ and $Q_2$, and mixer core 208 multiplies differential signals $Q_1$ and $I_2$. Now, the mathematical reasons for carrying out these multiplications will be examined. First, one observes that by simply squaring the I and Q signals, i.e., by forming the products $I_1 I_2$ and $Q_1 Q_2$, the desired phase quadrature relationship is destroyed. Looking at the time varying portion of these sinusoidal signals, the multiplication carried out in mixer cores 202 and 204 is expressed as:

$$I_1 I_2 = \cos(\omega_{LO} t) * \cos(\omega_{RF} t); \quad (11)$$

and $$Q_1 Q_2 = \sin(\omega_{LO} t) * \sin(\omega_{RF} t). \quad (12)$$

LO represents the frequency of the signal entering the mixer core LO ports, and RF represents the frequency of the signal entering the mixer core RF ports. In frequency doubler 200, these frequencies are identical. Equation (12) can be rewritten as:

$$Q_1 Q_2 = \cos[(\omega_{LO} t) - \pi/2] * \cos[(\omega_{RF} t) - \pi/2]. \quad (13)$$

Since:

$$\cos(a) * \cos(b) = \tfrac{1}{2}\cos(a+b) + \tfrac{1}{2}\cos(a-b), \quad (14)$$

equations (11) and (13) can be rewritten as:

$$I_1 I_2 = \tfrac{1}{2}\cos[(\omega_{LO}+\omega_{RF})*t] + \tfrac{1}{2}\cos[(\omega_{LO}-\omega_{RF})*t]; \quad (15)$$

and $$Q_1 Q_2 = \tfrac{1}{2}\cos[(\omega_{LO}+\omega_{RF})*t - \pi] + \tfrac{1}{2}\cos[(\omega_{LO}-\omega_{RF})*t]. \quad (16)$$

Hence, squaring the I and Q signals results in a doubling of phase, thereby losing the quadrature relationship between the signals. A different approach is to combine the I and Q signals in a constructive manner. That is, to multiply the quadrature components $I_1$ and $Q_2$ (mixer core 206) and the quadrature components $Q_1$ and $I_2$ (mixer core 208). These multiplications are described by the following relationships:

$$I_1 Q_2 = \cos(\omega_{LO} t) * \sin(\omega_{RF} t), \quad (17)$$

which is also equal to $$I_1 Q_2 = \cos(\omega_{LO} t) * \cos[(\omega_{RF} t) - \pi/2]. \quad (18)$$

Substituting the relationship expressed in equation (14), equation 18 becomes:

$$I_1 Q_2 = \tfrac{1}{2}\cos[(\omega_{LO}+\omega_{RF})*t - \pi/2] + \tfrac{1}{2}\cos[(\omega_{LO}-\omega_{RF})*t + \pi/2]. \quad (19)$$

Similarly, $$Q_1 I_2 = \tfrac{1}{2}\cos[(\omega_{LO}+\omega_{RF})*t - \pi/2] + \tfrac{1}{2}\cos[(\omega_{LO}-\omega_{RF})*t - \pi/2]. \quad (20)$$

Summing equations (19) and (20) yields:

$$I_1 Q_2 + Q_1 I_2 = \tfrac{1}{2}\cos[(\omega_{LO}+\omega_{RF})*t-\pi/2]+\tfrac{1}{2}\cos[(\omega_{LO}-\omega_{RF})*t+\pi/2]+\cos[(\omega_{LO}+\omega_{RF})*t-\pi/2]+\tfrac{1}{2}\cos[(\omega_{LO}-\omega_{RF})*t-\pi/2], \quad (21)$$

which can be reduced to:

$$I_1 Q_2 + Q_1 I_2 = \cos[(\omega_{LO}+\omega_{RF})*t-\pi/2] = Q'. \quad (22)$$

Subtracting equation (16) from equation (15) yields:

$$I_1 I_2 - Q_1 Q_2 = \tfrac{1}{2}\cos[(\omega_{LO}+\omega_{RF})*t]+\tfrac{1}{2}\cos[(\omega_{LO}-\omega_{RF})*t]-\tfrac{1}{2}\cos[(\omega_{LO}+\omega_{RF})*t-\pi]-\tfrac{1}{2}\cos[(\omega_{LO}-\omega_{RF})*t], \quad (23)$$

which can be reduced to $$I_1 I_2 - Q_1 Q_2 = \cos[(\omega_{LO}+\omega_{RF})*t] = I'. \quad (24)$$

Comparing equations (22) and (24), it can be seen that the frequency is equal to the sum of the LO and RF frequencies. In frequency doubler 200, these frequencies are the same. Hence, in each operation, the frequency is effectively doubled. Moreover, in equation (22), as indicated by the $\pi/2$ term, the ninety-degree phase shift is maintained. Hence, by driving the frequency doubling elements with the appropriate phase of signal and combining the outputs of the frequency translation element in an appropriate manner, the quadrature relationship between the two input signals is maintained whilst obtaining an output whose frequency is twice the input frequency (assuming LO and RF are equal).

Equation (24) is implemented by constructively combining the outputs of mixer cores 202 and 204. The collectors of transistors 502, 506, 512 and 516 are joined to generate the positive component of I', and the collectors of transistors 504, 508, 510 and 514 are joined to generate the negative component of I', wherein $I' = I_1 I_2 - Q_1 Q_2$. Similarly, equation (22) is implemented by constructively combining the outputs of mixer cores 206 and 208. The collectors of transistors 518, 522, 526 and 530 are joined to generate the positive component of Q', and the collectors of transistors 520, 524, 528 and 532 are joined to generate the negative component of Q', wherein $Q' = I_1 Q_2 + Q_1 I_2$.

As previously stated, the doubling process itself can create spurs. The double balanced frequency doubler configuration illustrated in FIG. 3 limits the effects of these spurs. By driving the mixers at one port with an in-phase signal and at another port with a phase-shifted signal, a low spurious content results. This is illustrated with reference to FIG. 4a. Feedthrough of voltage signal $V_1$ may not be filterable downstream and, therefore, may result in errors in the translated signal. It can be seen, however, that transistor pairs 604–608 and 606–610 add the $V_1$ signal components with opposite phases, thereby delivering a first order cancellation of signal $V_1$ in the output. Moreover, by sensing the output differentially, feedthrough of voltage signal $V_2$ is eliminated. By implementing this architecture, frequency doubler 200 is able to maintain a spurious signal sensing the output differentially, feedthrough of voltage signal $V_2$ is eliminated. By implementing this architecture, frequency doubler 200 is able to maintain a spurious signal level that is 40 dB down from the desired signal level. That is, the level of the desired LO signal is 100 times larger than the level of spurious noise signals.

Circuit 200 of FIG. 3 is just one architecture for implementing the mathematical relationships described above that double the frequency of quadrature input signals while maintaining in the output signal the quadrature relationship between the input signals. Alternative architectures may be used. Though the circuit is implemented by field effect devices, for example, other devices such as bipolar devices or n-terminal non-linear devices could also be used to implement the mathematical functions. Digital hardware and/or software could also be used.

Figure 5:
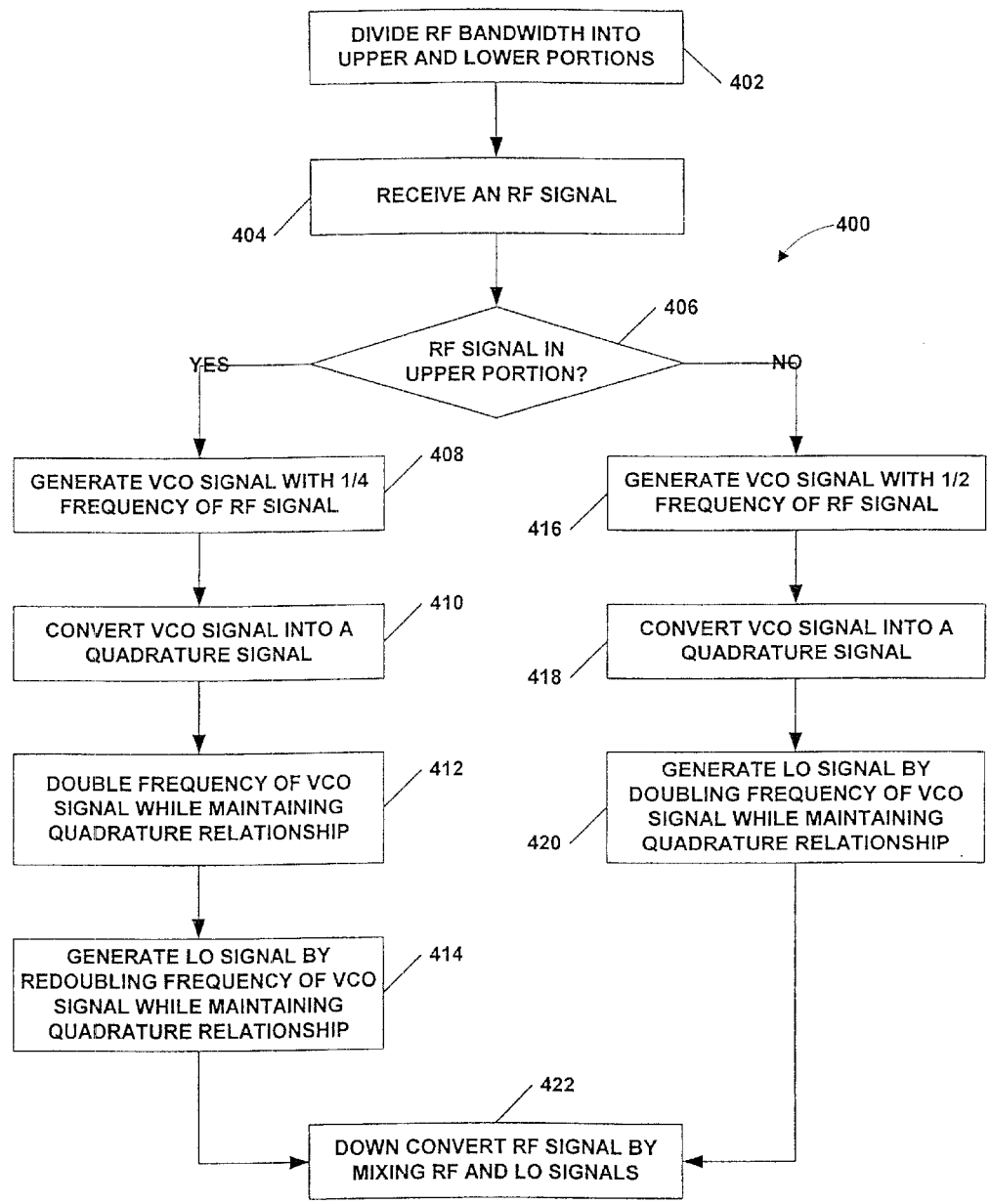
FIG. 5 is a flowchart depicting a method for generating an LO signal and down converting an RF signal according to the present invention.

A method 400 for down converting a received RF signal in accordance with the present invention is illustrated in FIG. 5. In step 402, the RF bandwidth is divided into upper and lower portions. In one implementation, the bandwidth of a DBS receiver extends from 950–2150 MHz and is divided into two halves: a lower half extending from 950–1800 MHz and an upper half extending from 1800–2150 MHz.

An RF signal is received in step 404. If the signal is in the lower portion of the RF bandwidth (decision node 406), the method proceeds to step 416. In step 416, a VCO signal is generated having a frequency that is one-half the frequency of the RF signal. In step 418, the VCO signal is passed through a phase shifter to yield an in-phase and quadrature signal. Next, an LO signal is generated by doubling the frequency of the VCO signal (step 420). In the doubling process, the phase relationship between the in-phase and quadrature input signals is maintained in the output signals. In step 422, the RF signal is down converted by mixing the RF and LO signals.

If in step 406 the signal was in the upper portion of the RF bandwidth, the method proceeds to step 408. In step 408, a VCO signal is generated having a frequency that is one quarter of the frequency of the RF signal. In step 410, the VCO signal is passed through a phase shifter to yield an in-phase and quadrature signal. Next, the frequency of the VCO signal is doubled while maintaining the phase relationship between the in-phase and quadrature input signals (step 412). The frequency is redoubled in step 414 to generate the LO signal. In step 422, the RF signal is down converted by mixing the RF and LO signals.

Figure 6:
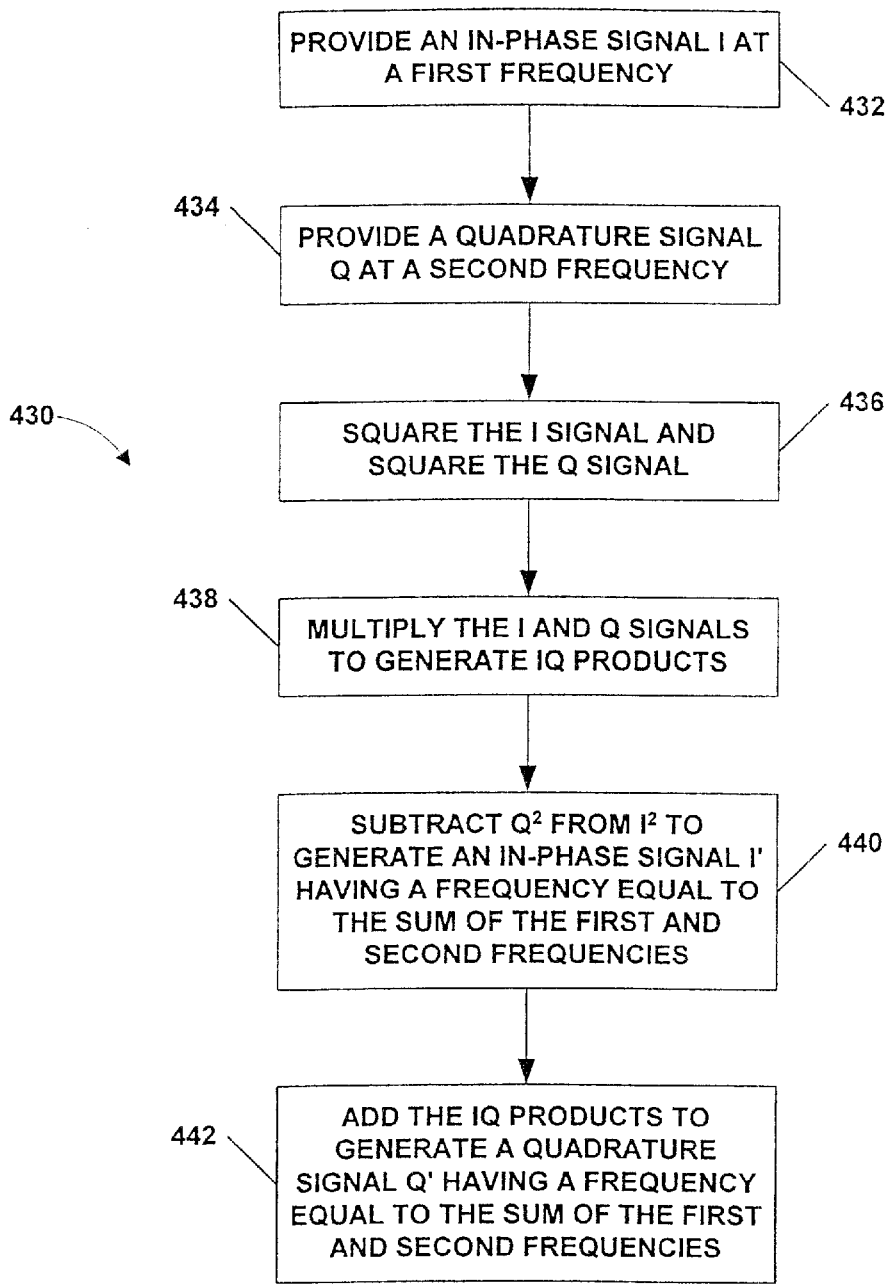
FIG. 6 is a flowchart depicting a method combining the frequencies of an in-phase and quadrature signal while maintaining the phase balance between the signals.

A method 430 for combining the frequencies of an in-phase signal I and a quadrature signal Q while maintaining the phase balance between the signals is illustrated in FIG. 6. An in-phase signal I having a first frequency is provided in step 432, and a quadrature signal Q having a second frequency is provided in step 434. In one implementation, as described above, the I and Q signals are differential signals derived from the same VCO signal and hence, have the same frequency.

In step 436, the I signal is squared and the Q signal is squared. In an implementation using mixer cores to combine the signals, as described in FIGS. 2 and 3, this is accomplished by feeding the I signal (or Q signal) to both the RF and LO input ports of the same mixer core. In step 438, the I and Q signals are combined (multiplied) to generate IQ products. In the frequency doubler set forth above, this is accomplished by supplying the I signal to the RF port and the Q signal to the LO port of one mixer core, and by supplying the I signal to the LO port and the Q signal to the RF port of another mixer core.

In step 440, the $Q^2$ product is subtracted from the $I^2$ product to generate an in-phase signal I' having a frequency equal to the sum of the first and second frequencies. Where, as set forth above, the input signals have the same frequency, the in-phase signal has a frequency twice that of the input frequency. In step 442, the IQ products are aded to generate a quadrature signal Q' having a frequency equal to the sum of the first and second frequencies. Again, in the implementation described herein, this will be twice the input frequency. Notably, the phase relationship between the in-phase output I' and the quadrature output Q' is the same as the phase relationship between the in-phase input I and the quadrature input Q.

Various embodiments and implementations of the present invention have been described with reference to the accompanying drawings. It should be understood, however, that these embodiments and implementations are set forth for exemplary purposes only. Modifications and substitutions may be made without departing from the scope of the invention, which is defined and limited only by the following claims and their equivalents.

What is claimed is:

1. A frequency doubler that receives a differential signal having an in-phase component I and a quadrature component Q and outputs a signal having a frequency that is double the frequency of the input signal and a phase balance that is the same as the phase balance of the input signal, wherein the frequency doubler comprises:

a first mixer core that receives the I component of the input signal on two input ports and mixes the I components to generate an I product;

a second mixer core that receives the Q component of the input signal on two input ports and mixes the Q components to generate a Q product;

means for subtracting the Q product from the I product to generate the in-phase component of the output signal;

a third mixer core that receives the I component of the input signal on one input port and the Q component on another input port and mixes the I and Q components to generate an IQ product;

a fourth mixer core that receives the I component of the input signal on one input port and the Q component on another input port and mixes the I and Q components to generate another IQ product; and means for adding the two IQ products to generate the quadrature component of the output signal.

2. An LO generation circuit implementing a frequency doubler as claimed in claim 1 for generating an LO signal to be used in down converting a received RF signal.

3. A device implementing an LO generation circuit as claimed in claim 2 that is selected from a group comprising a DBS tuner, a cable modem tuner and a wireless communications device.

4. A frequency doubler as claimed in claim 1, wherein the mixer cores comprise double-balanced differential transistor pairs.

5. A method for down converting an RF signal comprising:

dividing the potential RF bandwidth into upper and lower portions;

receiving an RF signal;

if the RF signal is in the lower portion of the bandwidth, generating a VCO signal having a frequency that is one-half the frequency of the RF signal, passing the VCO signal through a phase shifter to yield an in-phase and a quadrature signal, and generating an LO signal by doubling the frequency of the VCO signal while maintaining the phase relationship between the in-phase and quadrature input signals;

if the RF signal is in the upper portion of the bandwidth, generating a VCO signal having a frequency that is one-fourth the frequency of the RF signal, passing the VCO signal through a phase shifter to yield an in-phase and a quadrature signal, doubling the frequency of the VCO signal while maintaining the phase relationship between the in-phase and quadrature input signals, and redoubling the frequency of the VCO signal to generate the LO signal; and down converting the RF signal by mixing the RF and LO signals.

6. A method as claimed in claim 5, wherein the RF bandwidth extends from 950 to 2150 MHz.

7. A method as claimed in claim 6, wherein the RF bandwidth is divided into a lower portion extending from 950–1800 MHz and an upper portion extending from 1800–2150 MHz.

8. An LO signal generation circuit for generating an LO signal to down convert an RF signal within an RF bandwidth comprising:

- a VCO that generates a signal having a frequency within a bandwidth that is a subset of the RF bandwidth;
- a first phase shifter coupled to the VCO that converts the VCO signal into a quadrature VCO signal having an in-phase component I and a phase-shifted component Q;
- a first frequency doubler coupled to the first phase shifter that doubles the frequency of the quadrature VCO signal while maintaining the phase relationship between the quadrature components;
- a second frequency doubler coupled to the first frequency doubler that redoubles the frequency of the signal output by the first frequency doubler to output a signal having a quadrupled VCO frequency; and
- a switch that selects one of the outputs from the first frequency doubler or second frequency doubler as the LO signal.

9. A device implementing an LO generation circuit as claimed in claim 8 that is selected from a group comprising a DBS tuner, a cable modem tuner and a wireless communications device.

10. An LO generation circuit as claimed in claim 8, wherein the switch is coupled to only the quadrature output components from the first and second frequency doublers.

11. An LO generation circuit as claimed in claim 10, and further comprising a second phase coupled to the output of the switch to convert the LO signal into in-phase and quadrature components.

12. An LO generation circuit as claimed in claim 1, wherein each frequency doubler comprises four mixer cores that constructively combine the I and Q signals.

13. An LO generation circuit as claimed in claim 12, wherein each mixer core has an RF port and an LO port, and wherein a first mixer core receives the I signal on its RF port and its LO port to output an I product; a second mixer core receives the Q signal on its RF port and its LO port to output a Q product; a third mixer core receives the I signal on its LO port and the Q signal on its RF port to output a first IQ product; and wherein the third mixer core receives the I signal on its RF port and the Q signal on its LO port to output a second IQ product.

14. An LO generation circuit as claimed in claim 13, wherein the Q product is subtracted from the I product to generate an in-phase portion of the quadrature signal having a doubled frequency, and wherein the IQ products are added to generate a quadrature portion of the quadrature signal having doubled frequency.

15. An LO generation circuit as claimed in claim 13, wherein the signals input to and output from the mixer cores are differential signals.

16. An LO generation circuit as claimed in claim 12, wherein the mixer cores comprise double-balanced differential transistor pairs.

17. A method for combining the frequencies of an in-phase signal I and a quadrature signal Q while maintaining the phase balance between the signals comprising:

- providing an in-phase signal I having a first frequency;
- providing a phase-shifted signal Q having a second frequency;
- squaring the I signal and the Q signal to generate an I product and a Q product;
- multiplying the I and Q signals to generate first and second IQ products;
- subtracting the Q product from the I product to generate an in-phase signal I' having a frequency equal to the sum of the first and second frequencies; and
- adding the first and second IQ products to generate a quadrature signal Q' having a frequency equal to the sum of the first and second frequencies, wherein the phase relationship between the in-phase output signal I' and the quadrature output signal Q' is the same as the phase relationship between the in-phase input signal I and the quadrature input signal Q.

18. A method as claimed in claim 17, wherein the I and Q signals are differential signals derived from one VCO signal and the first and second frequencies are therefore identical.

19. A method as claimed in claim 18, wherein the IQ products are generated by supplying the I signal to the RF port and the Q signal to the LO port of one mixer core, and by supplying the I signal to the LO port and the Q signal to the RF port of another mixer core.

20. A method as claimed in claim 18, wherein the I product and the Q product are generated by supplying the I signal to both input ports of a first mixer core and the Q signal to both input ports of a second mixer core.

* * * * *